(12) United States Patent
Chen et al.

(10) Patent No.: US 9,307,670 B2
(45) Date of Patent: Apr. 5, 2016

(54) COMPUTER HOST CASE STRUCTURE

(71) Applicant: Wistron Corporation, New Taipei (TW)

(72) Inventors: Kuang-Wen Chen, New Taipei (TW); Gui-Dong Gan, New Taipei (TW)

(73) Assignee: Wistron Corporation, New Taipei (TW)

( * ) Notice: Subject to any disclaimer, the term of this patent is extended or adjusted under 35 U.S.C. 154(b) by 185 days.

(21) Appl. No.: 14/153,461

(22) Filed: Jan. 13, 2014

(65) Prior Publication Data

US 2015/0108883 A1    Apr. 23, 2015

(30) Foreign Application Priority Data

Oct. 22, 2013 (CN) .......................... 2013 1 0499862

(51) Int. Cl.
*H05K 7/16* (2006.01)
*G06F 1/18* (2006.01)

(52) U.S. Cl.
CPC *H05K 7/16* (2013.01); *G06F 1/181* (2013.01); *G06F 1/187* (2013.01)

(58) Field of Classification Search
CPC .............. H05K 7/16; H05K 7/14; G06F 1/18; G06F 1/187; G06F 1/1681; G06F 1/183
See application file for complete search history.

(56) References Cited

U.S. PATENT DOCUMENTS

| | | | | |
|---|---|---|---|---|
| 5,169,221 A * | 12/1992 | Wheeler | ................ | A47B 88/06 16/358 |
| 5,359,489 A * | 10/1994 | Hass | ........................ | H05K 7/16 361/732 |
| 5,406,452 A * | 4/1995 | Uchiumi | ................... | H05K 7/16 361/610 |
| 6,215,664 B1 * | 4/2001 | Hernandez | .............. | G06F 1/181 361/725 |
| 6,404,625 B1 * | 6/2002 | Chen | ....................... | G06F 1/187 312/223.1 |
| 7,639,488 B2 * | 12/2009 | Tu | ........................ | G11B 33/121 248/618 |
| 2002/0179784 A1 * | 12/2002 | Mehta | .................... | F16M 11/00 248/129 |
| 2004/0075979 A1 | 4/2004 | Wang et al. | | |
| 2014/0192503 A1 * | 7/2014 | Chen | ....................... | G06F 1/183 361/807 |
| 2014/0268510 A1 * | 9/2014 | Su | ............................ | H05K 7/16 361/679.01 |
| 2015/0036270 A1 * | 2/2015 | Chen | .................... | G06F 1/1681 361/679.02 |

FOREIGN PATENT DOCUMENTS

| | | |
|---|---|---|
| TW | 201107927 A1 | 3/2011 |
| TW | M450180 U1 | 4/2013 |

* cited by examiner

*Primary Examiner* — Hoa C Nguyen
*Assistant Examiner* — Keith Depew
(74) *Attorney, Agent, or Firm* — Muncy, Geissler, Olds & Lowe, P.C.

(57) ABSTRACT

A computer host case structure for fastening at least one electronic device is disclosed. The computer host case includes a main body, two pivot structures, an electronic device fastening set, and two pivot axes. The pivot structure includes a notch. Two pivot axes are used for pivotally connecting to the pivot structure. The electronic device fastening set is fastened to at least one electronic device. When the electronic device fastening set rotates to a specific angle relative to the main body via the pivotal connection between the pivot axes and the pivot structures, the two pivot axes respectively enter the notches of the two pivot structures.

13 Claims, 11 Drawing Sheets

COMPUTER HOST CASE STRUCTURE

BACKGROUND OF THE INVENTION

1. Field of the Invention

The present invention relates to a computer host case structure; more particularly, the present invention relates to a computer host case structure that can be assembled with an electronic device (such as a hard disk drive) quickly.

2. Description of the Related Art

The computer is an important device in modern life. In the host case of the common computer, there is a structure for installing a hard drive and a CD-ROM drive, allowing the user to install a variety of types of hard disk drives and CD-ROM drives. The common structure for installing the hard disk drive and the CD-ROM drive consists of screws and the corresponding screw holes; the hard disk drive and the CD-ROM drive can be fastened to the host case of the computer via the screws and the screw holes.

However, the time cost of installing a hard disk drive and a CD-ROM drive via the screws and the corresponding screw holes is high, and the screws entail certain material costs. Therefore, it is hard to reduce the production cost if screws and corresponding screw holes are used to fasten a hard disk drive and a CD-ROM drive in the computer host case.

Therefore, there is a need to provide a new computer host case structure. The new computer host case structure is not designed such that data drives are installed via screws and screw holes, and this design increases the convenience of installation and reduces the material and manual assembly costs.

SUMMARY OF THE INVENTION

It is an object of the present invention to provide a computer host case structure in which an electronic device can be installed quickly.

To achieve the abovementioned object, the computer host case structure of the present invention is used for fastening at least one electronic device. The computer host case includes a main body, two pivot structures, an electronic device fastening set, and two pivot axes. The pivot structure includes a notch. The two pivot axes are used for pivotally connecting to the pivot structure. The electronic device fastening set is fastened to at least one electronic device. When the electronic device fastening set rotates to a specific angle relative to the main body via the pivotal connection between the pivot axes and the pivot structures, the two pivot axes respectively enter the notches of the two pivot structures.

According to one embodiment of the present invention, the computer host case structure further includes a pivot part. The pivot part is connected to the main body. The pivot structure is located on the pivot part, and the pivot axis is located on the electronic device fastening set.

According to one embodiment of the present invention, the computer host case structure further includes a pivot part. The pivot part is connected to the main body. The pivot structure is located on the electronic device fastening set, and the pivot axis is located on the pivot part.

According to one embodiment of the present invention, the pivot structure further includes a pivot hole and an opening. The pivot hole is connected to the notch and the opening.

According to one embodiment of the present invention, the pivot axis includes two long sides and two arc sides. The distance between the two long sides is corresponded to the size of the notch and the opening. The distance between the two arc sides is corresponded to the size of the pivot hole.

According to one embodiment of the present invention, when the electronic device fastening set rotates to a specific angle relative to the main body via the pivotal connection between the two pivot axes and the two pivot structures, the two long sides become aligned with the notch, allowing the pivot axis to enter the notch.

According to one embodiment of the present invention, the computer host case structure further includes at least one buffer unit. The at least one buffer unit is located on the pivot part. When the electronic device rotates relative to the main body, the buffer unit contacts the electronic device fastening set.

According to one embodiment of the present invention, the buffer unit further includes an arcuate portion. When the electronic device rotates relative to the main body, the arcuate portion contacts the electronic device fastening set.

According to one embodiment of the present invention, the buffer unit further includes a stopper portion. When the pivot axis enters the notch, the movement of the electronic device fastening set is limited by the stopper portion.

According to one embodiment of the present invention, the electronic device fastening set further includes two fixing parts. The two fixing parts fasten to the two sides of the at least one electronic device.

According to one embodiment of the present invention, the computer host case structure further includes at least one fastening part. The at least one fastening part is located on the pivot part. When the pivot axis enters the notch, the fastening part is correspondingly fastened to the fixing part.

According to one embodiment of the present invention, the fastening part further includes a fastening point, and the fixing part further includes a fastening unit. When the pivot axis enters the notch, the fastening point is fastened to the fastening unit.

According to one embodiment of the present invention, the range of the specific angle is 70° to 100°.

DETAILED DESCRIPTION OF THE PREFERRED EMBODIMENT

These and other objects and advantages of the present invention will become apparent from the following descriptions of the accompanying drawings, which disclose several embodiments of the present invention. It is to be understood that the drawings are to be used for purposes of illustration only and not as a definition of the invention.

Figure 1:
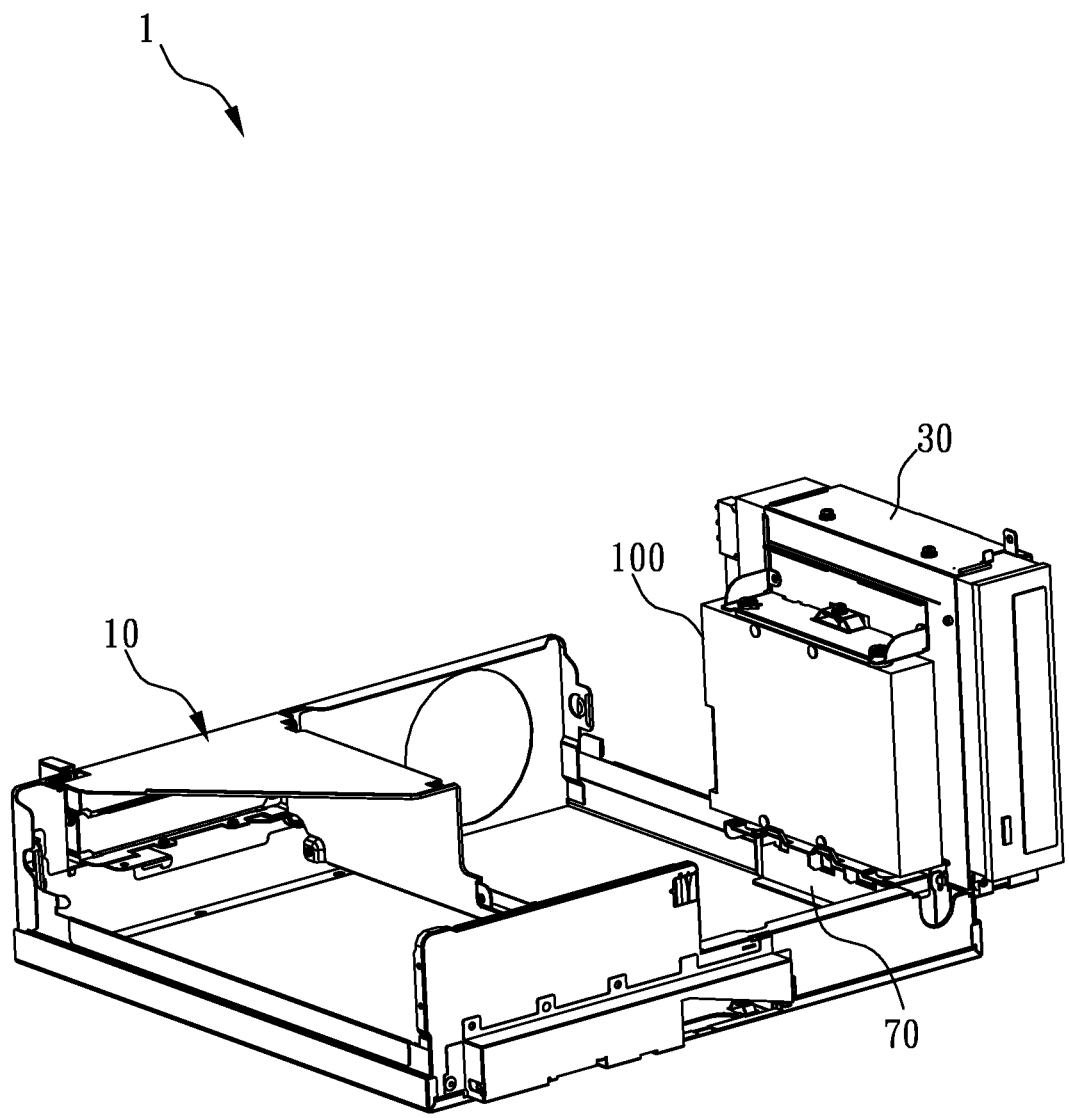
FIG. 1 illustrates a schematic drawing of the computer host case structure of the first embodiment of the present invention.
Figure 2:
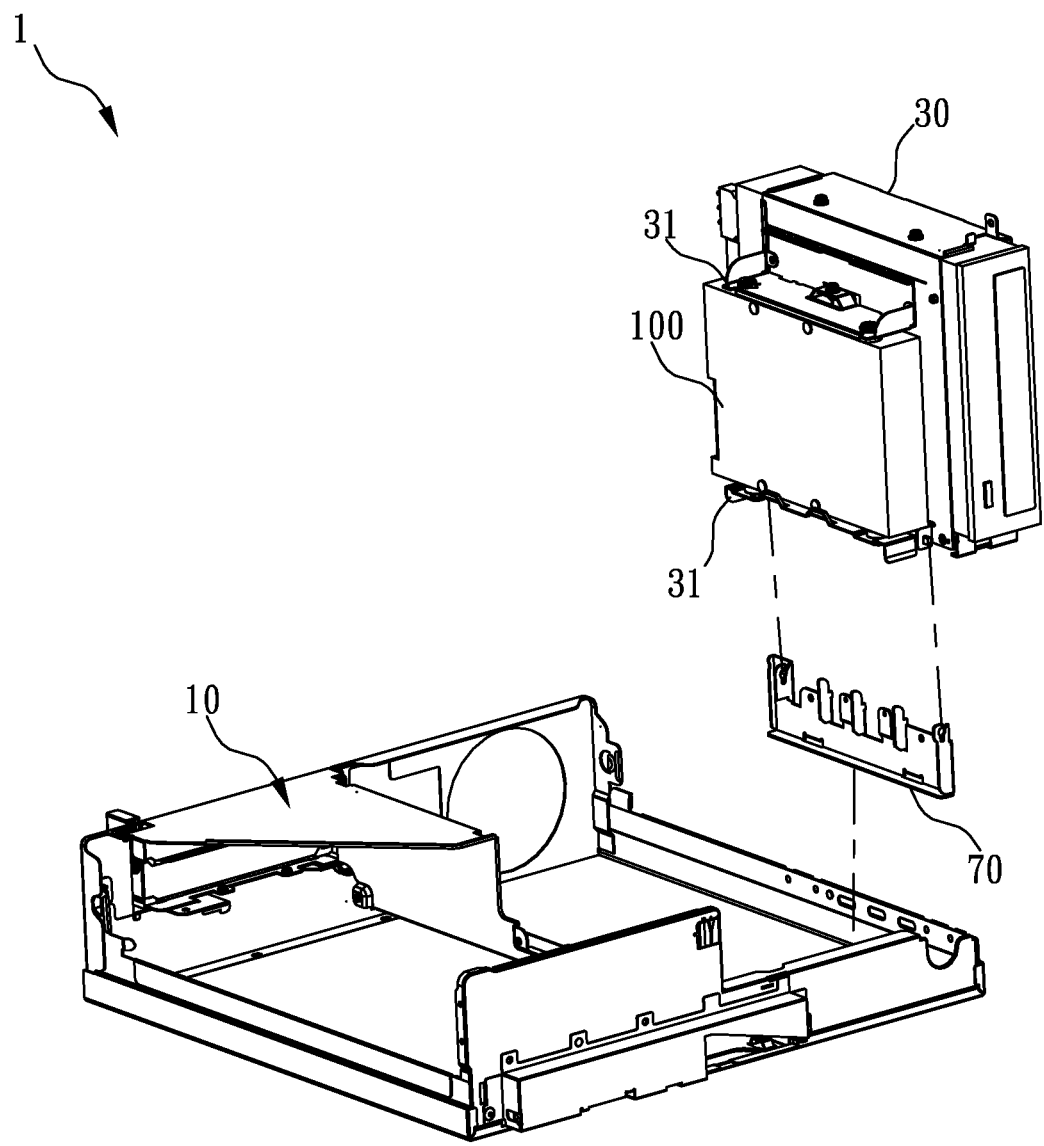
FIG. 2 illustrates a schematic drawing of the separated pivot part and the electronic device fastening set of the first embodiment of the present invention.
Figure 3:
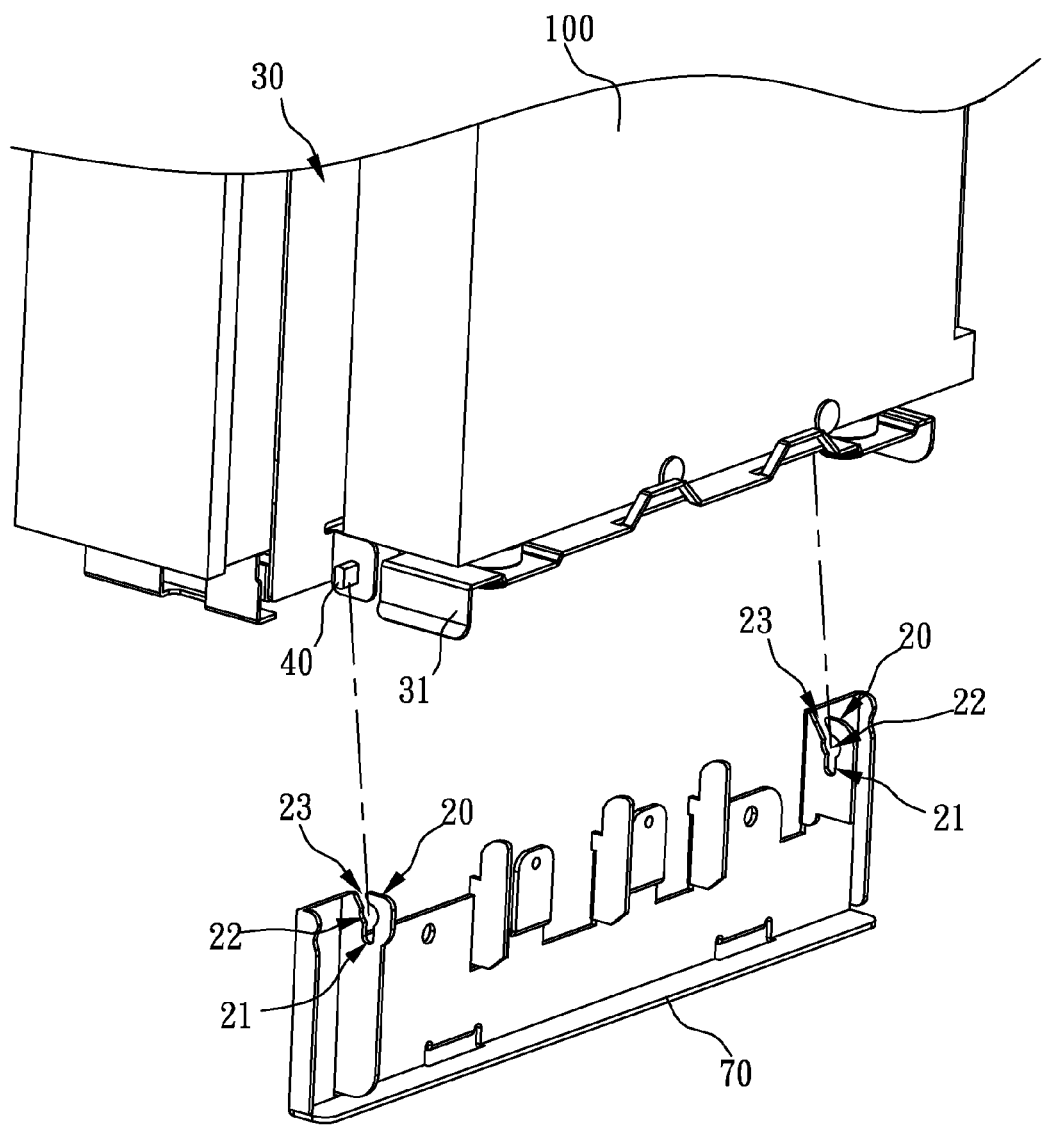
FIG. 3 illustrates a partial schematic drawing of the separated pivot part and the electronic device fastening set of the first embodiment of the present invention.
Figure 4:
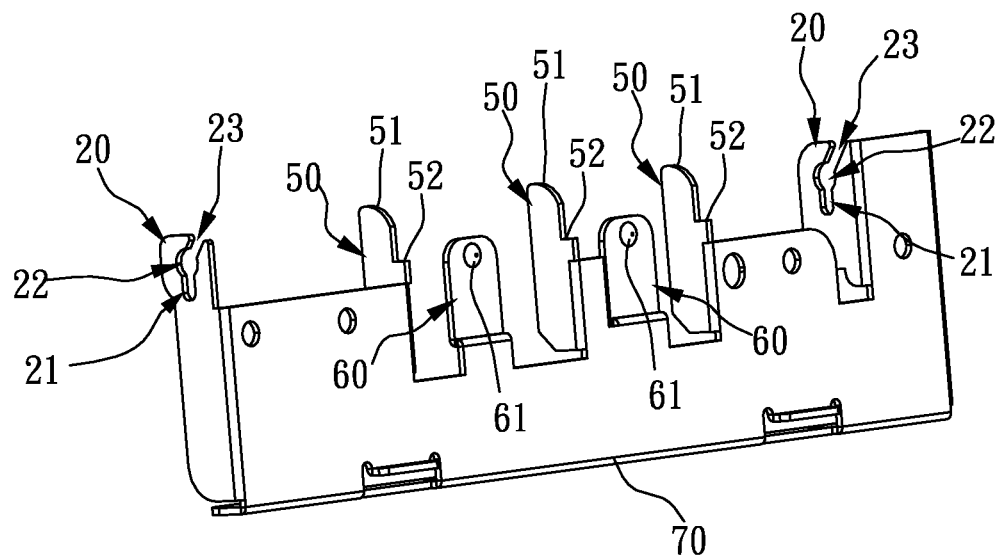
FIG. 4 illustrates a schematic drawing of the pivot part of the first embodiment of the present invention.
Figure 5:
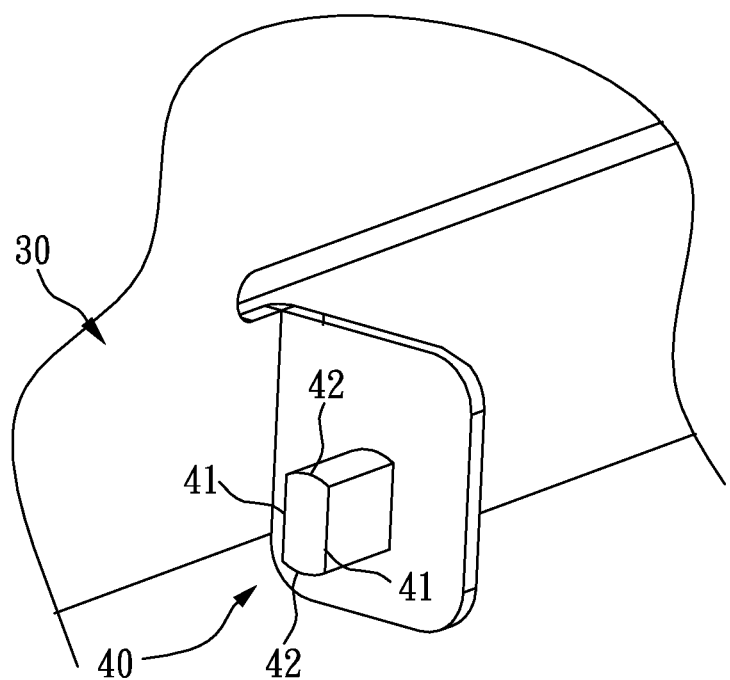
FIG. 5 illustrates a schematic drawing of the pivot axis of the first embodiment of the present invention.
Figure 6:
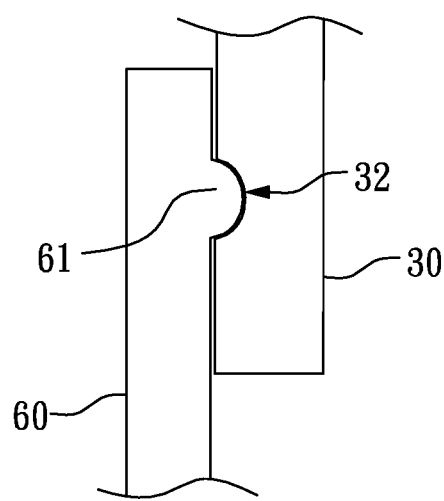
FIG. 6 illustrates a schematic drawing of the fastening part and the electronic device fastening set of the first embodiment of the present invention in the fastened state.
Figure 7:
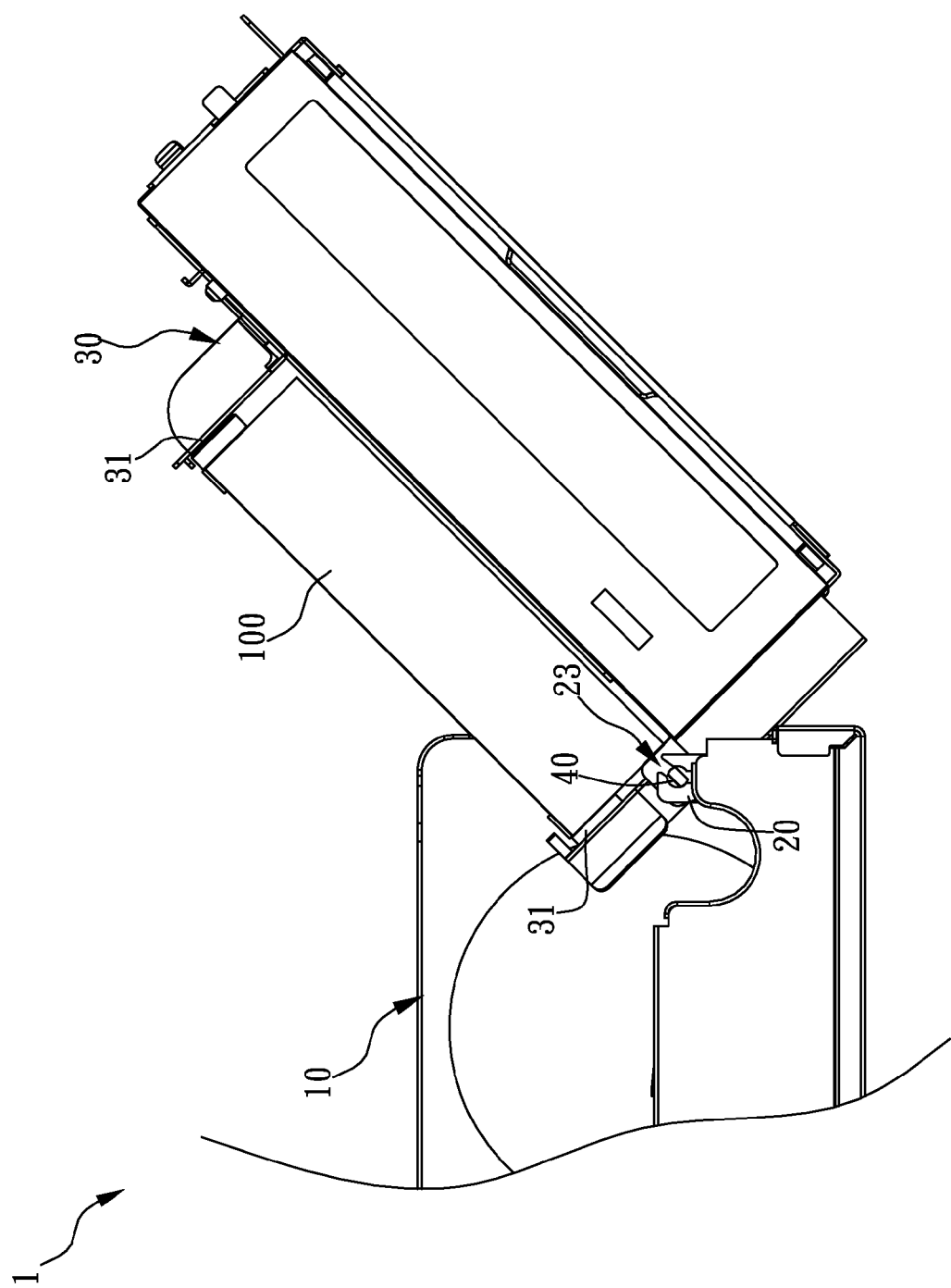
FIG. 7 illustrates a schematic drawing of the pivot axis that enters the pivot structure of the first embodiment of the present invention.
Figure 8:
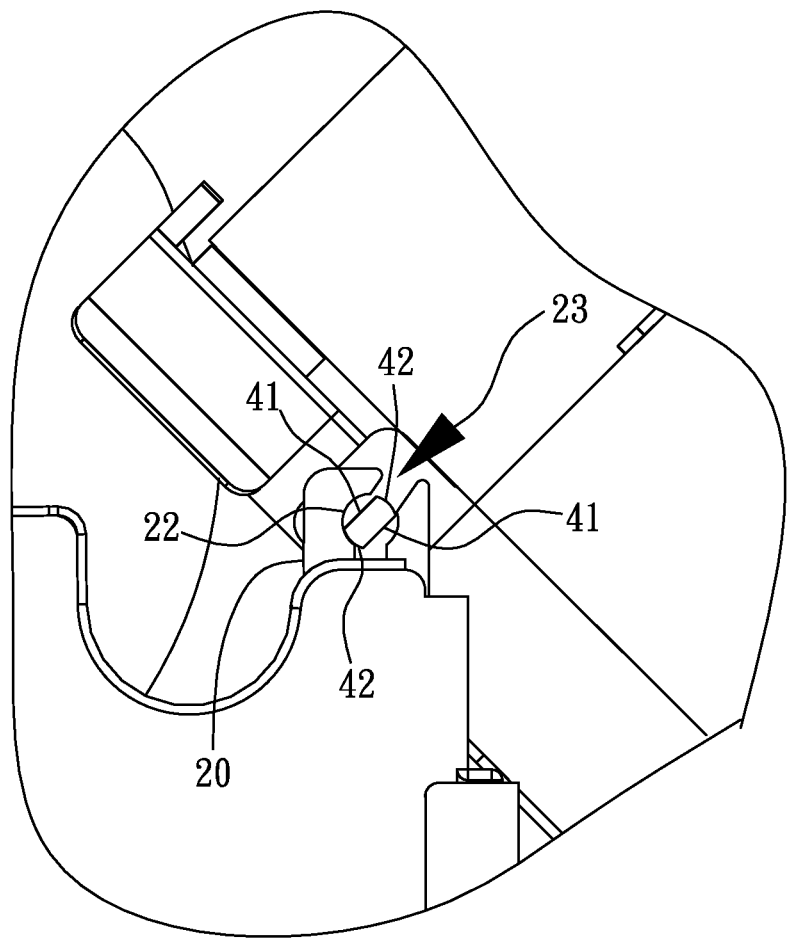
FIG. 8 illustrates a partial schematic drawing of the pivot axis that enters the pivot structure of the first embodiment of the present invention.
Figure 9:
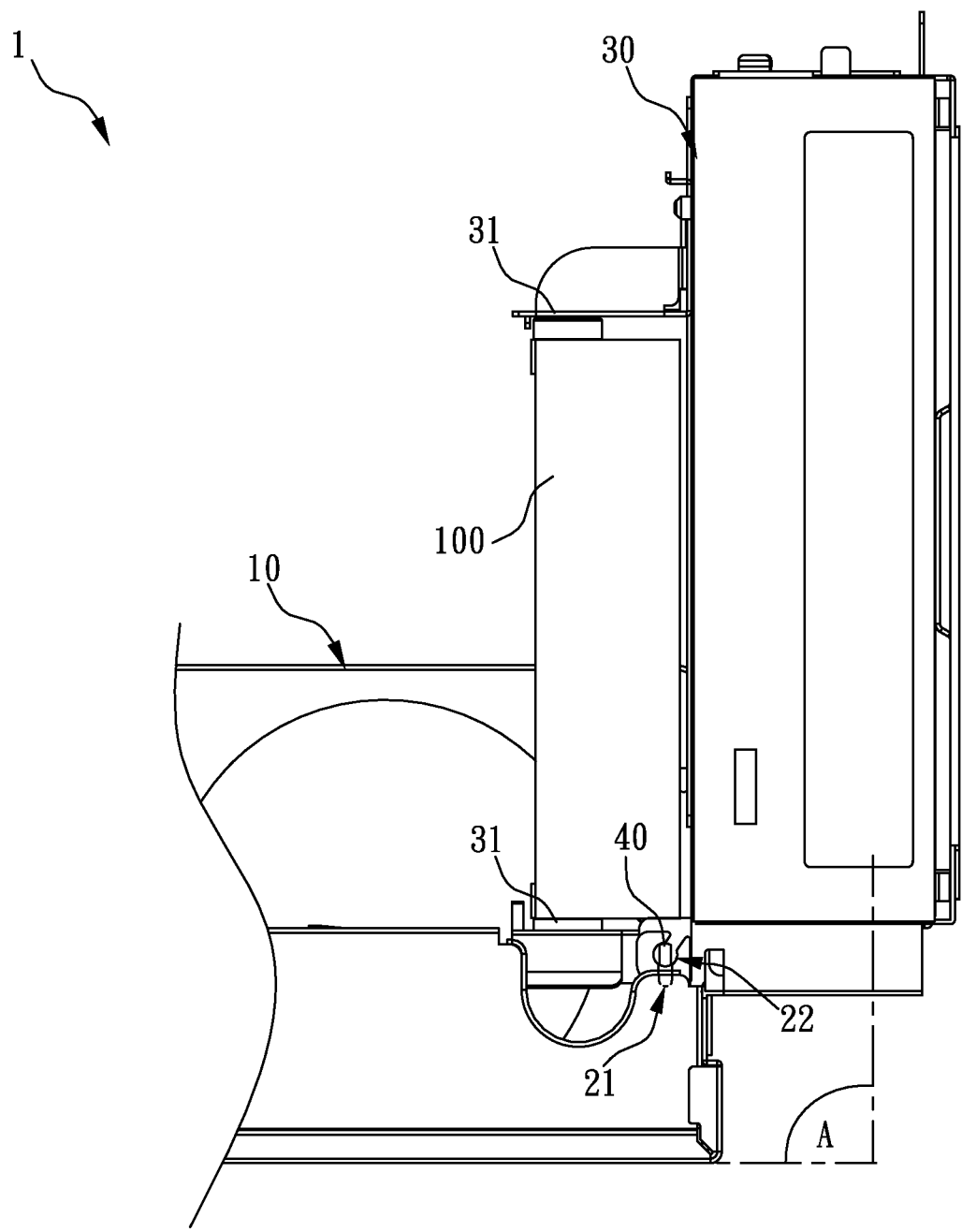
FIG. 9 illustrates a schematic drawing of the electronic device fastening set of the first embodiment of the present invention when rotated to a specific angle.
Figure 10:
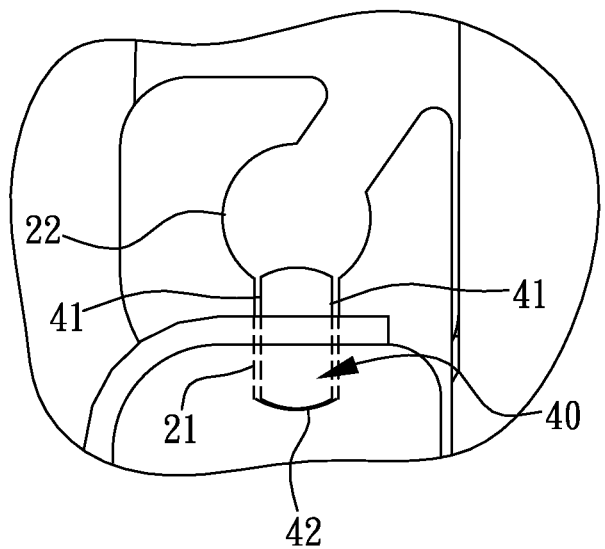
FIG. 10 illustrates a partial schematic drawing of the electronic device fastening set of the first embodiment of the present invention when rotated to a specific angle.
Figure 11:
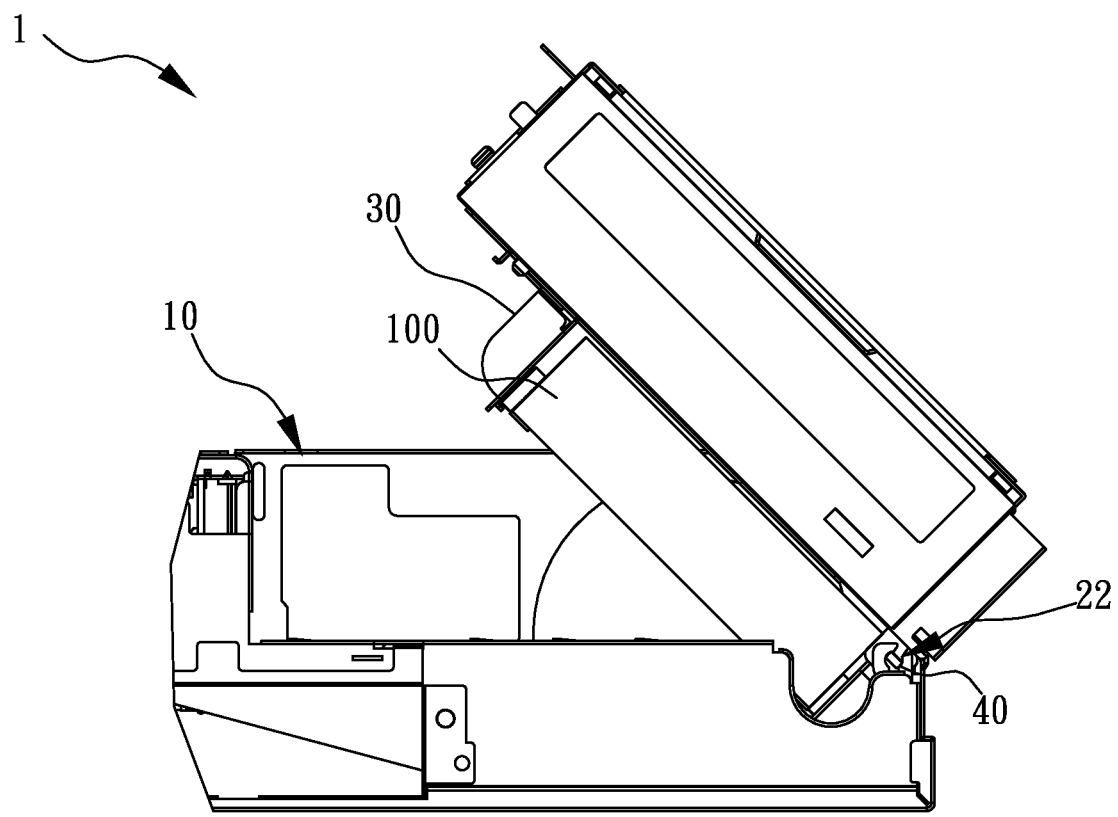
FIG. 11 illustrates a schematic drawing of the electronic device fastening set of the first embodiment of the present invention when rotated toward the main body.
Figure 12:
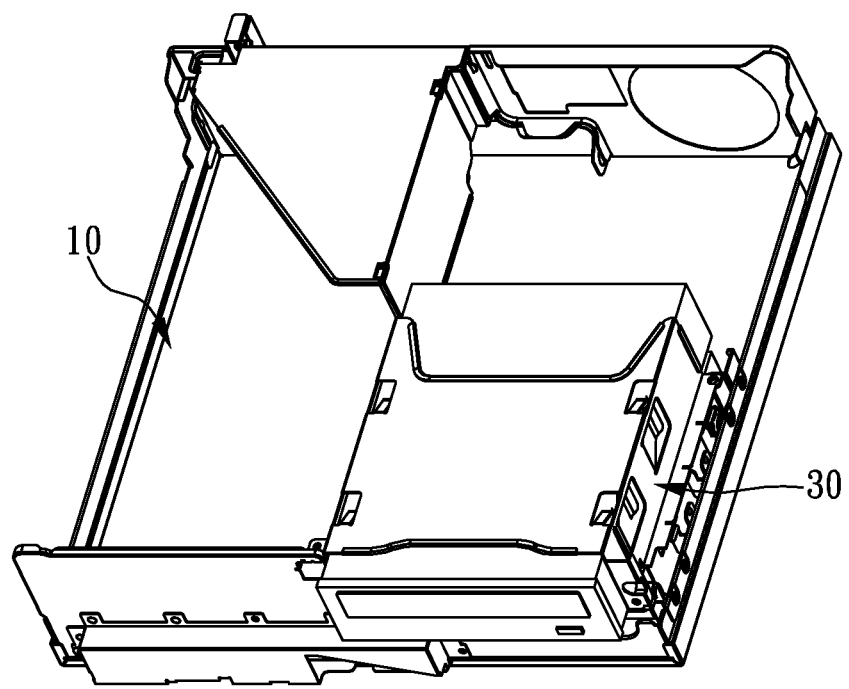
FIG. 12 illustrates a schematic drawing of the electronic device fastening set of the first embodiment of the present invention when rotated to be contained in the main body.

Please refer to FIG. 1 to FIG. 12, which illustrate the computer host case structure 1 according to the first embodiment of the present invention. FIG. 1 illustrates a schematic drawing of the computer host case structure 1 of the first embodiment of the present invention. FIG. 2 illustrates a schematic drawing of the separated pivot part 70 and electronic device fastening set 30 of the first embodiment of the present invention. FIG. 3 illustrates a partial schematic drawing of the separated pivot part 70 and the electronic device fastening set 30 of the first embodiment of the present invention. FIG. 4 illustrates a schematic drawing of the pivot part 70 of the first embodiment of the present invention. FIG. 5 illustrates a schematic drawing of the pivot axis 40 of the first embodiment of the present invention. FIG. 6 illustrates a schematic drawing of the fastening part 60 and the electronic device fastening set 30 of the first embodiment of the present invention in the fastened state. FIG. 7 illustrates a schematic drawing of the pivot axis 40 that enters the pivot structure 20 of the first embodiment of the present invention. FIG. 8 illustrates a partial schematic drawing of the pivot axis 40 that enters the pivot structure 20 of the first embodiment of the present invention. FIG. 9 illustrates a schematic drawing of the electronic device fastening set 30 of the first embodiment of the present invention when rotated to a specific angle A. FIG. 10 illustrates a partial schematic drawing of the electronic device fastening set 30 of the first embodiment of the present invention when rotated to a specific angle A. FIG. 11 illustrates a schematic drawing of the electronic device fastening set 30 of the first embodiment of the present invention when rotated toward the main body 10. FIG. 12 illustrates a schematic drawing of the electronic device fastening set 30 of the first embodiment of the present invention when rotated to be contained in the main body 10.

As shown in FIG. 1 to FIG. 4, the computer host case structure 1 of the first embodiment of the present invention can be a case of a desktop computer for fastening an electronic device 100. The electronic device 100 of the present invention can be a hard disk drive, but the type of the electronic device 100 is not limited to that application; it can also be a CD-ROM drive or other device that can be installed in the desktop computer. The number of the electronic devices 100 is not limited to one; the number can be changed according to varied requirements. The computer host case structure 1 includes a main body 10, a pivot part 70, two pivot structures 20, an electronic device fastening set 30, two pivot axes 40, three buffer units 50, and two fastening parts 60.

In the first embodiment of the present invention, the main body 10 is used for containing the internal components of the computer, such as a motherboard, a power system, and the hard disk drive of the electronic device 100. The main body 10 may have the fastening structures in the position of the internal components for fastening the internal components. The pivot part 70 is connected to the main body 10. The two pivot structures 20 respectively include a notch 21, a pivot hole 22, and an opening 23. The pivot hole 22 is connected to the notch 21 and the opening 23. The two pivot structures 20 of the first embodiment are located on the pivot part 70.

As shown in FIG. 2 and FIG. 6, in the first embodiment of the present invention, the electronic device fastening set 30 includes two fixing parts 31 and two fastening units 32. The two sides of the electronic device 100 are fastened by the fixing parts 31. The surface of the electronic device 100 that contacts the fixing part 31 may be designed to have a cushion with a buffer effect to prevent the electronic device 100 from being scratched, and the cushion may absorb the external force to achieve a cushioning effect. However, the number of the fixing parts 31 is not limited to two; the number can be changed according to the number of the electronic devices 100. The fastening unit 32 is a circular cavity for fastening the fastening part 60.

As shown in FIG. 4, FIG. 5, and FIG. 7 to FIG. 10, in the first embodiment of the present invention, the two pivot axes 40 are located on the electronic device fastening set 30 for pivotally connecting to the pivot hole 22 of the pivot structure 20 respectively; the electronic device fastening set 30 can rotate via the pivotal connection between the two pivot axes 40 and the pivot structure 20. The pivot axis 40 includes two long sides 41 and two arc sides 42. The distance between the two long sides 41 is corresponded to the size of the notch 21 and the opening 23. The distance between the two arc sides 42 is corresponded to the size of the pivot hole 22. When the electronic device fastening set 30 moves, the long side 41 of the pivot axis 40 becomes aligned with the opening 23 such that the pivot axis 40 can easily enter the opening 23 from the outside, allowing the pivot axis 40 to enter the pivot hole 22. When the electronic device fastening set 30 rotates to a specific angle A relative to the main body 10, the long side 41 of the pivot axis 40 becomes aligned with the notch 21, and the pivot axis 40 can enter the notch 21. The arc side 42 of the pivot axis 40 can rotate in the pivot hole 22. The specific angle A of the present invention is 90° substantially; however, the angle of the specific angle A is not limited to that design, for the specific angle A can be changed according to varied requirements. According to the experiment of the present invention, the specific angle A is preferred to be in a range of 70° to 100°.

As shown in FIG. 4, in the first embodiment of the present invention, three buffer units 50 are located on the pivot part 70. The buffer unit 50 includes an arcuate portion 51 and a stopper portion 52. The arcuate portion 51 contacts the electronic device fastening set 30 for providing friction to the electronic device fastening set 30, such that when the user adjusts the position of the electronic device fastening set 30, the electronic device fastening set 30 is prevented from generating any violent shaking that could affect the electronic device 100 fastened by the electronic device fastening set 30. The stopper portion 52 is used for allowing the electronic device fastening set 30 to limit the movement of the electronic device fastening set 30 when the pivot axis 40 enters the notch 21. However, the number of the buffer units 50 of the present invention is not limited to three; according to the actual experiment of the present invention, if the number of the buffer units 50 is more than two, the buffer effect will be sufficiently provided to a preferred degree; however, if the number of the buffer units 50 is one, a slight buffer effect will still be provided; therefore, the number of the buffer units 50 can be changed according to varied requirements.

As shown in FIG. 4, FIG. 6 and FIG. 9, in the first embodiment of the present invention, the two fastening parts 60 are located on the pivot part 70. Each fastening part 60 includes a fastening point 61. The fastening point 61 is a circular convex dot for fastening the fastening unit 32 of the electronic device fastening set 30. When the electronic device fastening set 30 rotates to the specific angle A relative to the main body 10, the pivot axis 40 enters the notch 21, and the circular convex dot of the fastening point 61 also moves to the circular cavity of the fastening unit 32, such that the fastening point 61 of the fastening part 60 can be fastened to the fastening unit 32 of the electronic device fastening set 30. However, the number of the fastening parts 60 of the present invention is not limited to two.

When the user wants to apply the computer host case structure 1 of the present invention to install the electronic device 100, as shown in FIG. 2, the user can fasten the fixing part 31 of the electronic device fastening set 30 to the two sides of the electronic device 100. Then, as shown in FIG. 5, FIG. 7, and FIG. 8, the user can adjust the angle of the electronic device fastening set 30 which fastens to the electronic device 100, allowing the long side 41 of the pivot axis 40 to become aligned with the opening 23 such that the pivot axis 40 can smoothly pass through the opening 23 into the pivot hole 22, whereby the pivot axis 40 can be pivotally connected to the pivot structure 20, and the electronic device fastening set 30 can rotate relative to the main body 10 via the pivotal connection between the pivot axis 40 and the pivot structure 20. Then, as shown in FIG. 4, FIG. 11, and FIG. 12, the user can rotate the electronic device fastening set 30 which is fastened to the electronic device 100 toward the main body 10; during the rotation, the arcuate portion 51 of the three buffer units 50 contacts the electronic device fastening set 30 to provide friction to the electronic device fastening set 30 to avoid rotation that could generate shaking that in turn could affect the electronic device 100 fastened by the electronic device fastening set 30. The electronic device fastening set 30 can rotate to be completely contained in the main body 10 (as shown in FIG. 12), such that the assembly and installation of the electronic device 100 and the computer host case structure 1 can be completed.

If the electronic device 100 needs to be repaired, then as shown in FIG. 4 to FIG. 6, FIG. 9, and FIG. 10, the user can rotate the electronic device fastening set 30 to the specific angle A relative to the main body 10. At this moment, the long side 41 of the pivot axis 40 becomes aligned with the notch 21, allowing the pivot axis 40 to enter the notch 21. Because the distance between the two long sides 41 is corresponded to the size of the notch 21, the pivot axis 40 can be in the notch 21 stably and be unable to rotate. When the pivot axis 40 enters the notch 21, the circular convex dot of the fastening point 61 moves to the circular cavity of the fastening unit 32, and the stopper portion 52 limits the movement of the electronic device fastening set 30. Therefore, via the combination of the entering of the pivot axis 40 to the notch 21, the fastening between the circular convex dot of the fastening point 61 and the circular cavity of the fastening unit 32, and the limiting of movement by the stopper portion 52 of the electronic device fastening set 30, the electronic device fastening set 30 connected to the pivot axis 40 can be positioned stably. Therefore, the maintenance worker can disassemble the fixing part 31 to remove the electronic device 100 from the electronic device fastening set 30 in preparation for repairing the electronic device 100.

Via the computer host case structure 1 of the present invention, the user can install the electronic device 100 easily and quickly. If the user needs to fix or replace the electronic device 100, via the design of the notch 21 of the pivot structure 20, the buffer unit 50 and the fastening part 60, the user can remove the electronic device fastening set 30 from the electronic device 100 easily without causing any shaking, such that the electronic device 100 will not be damaged. In addition, the computer host case structure 1 of the present invention does not have the screws and screw holes of the prior art, so the cost can be reduced.

Figure 13:
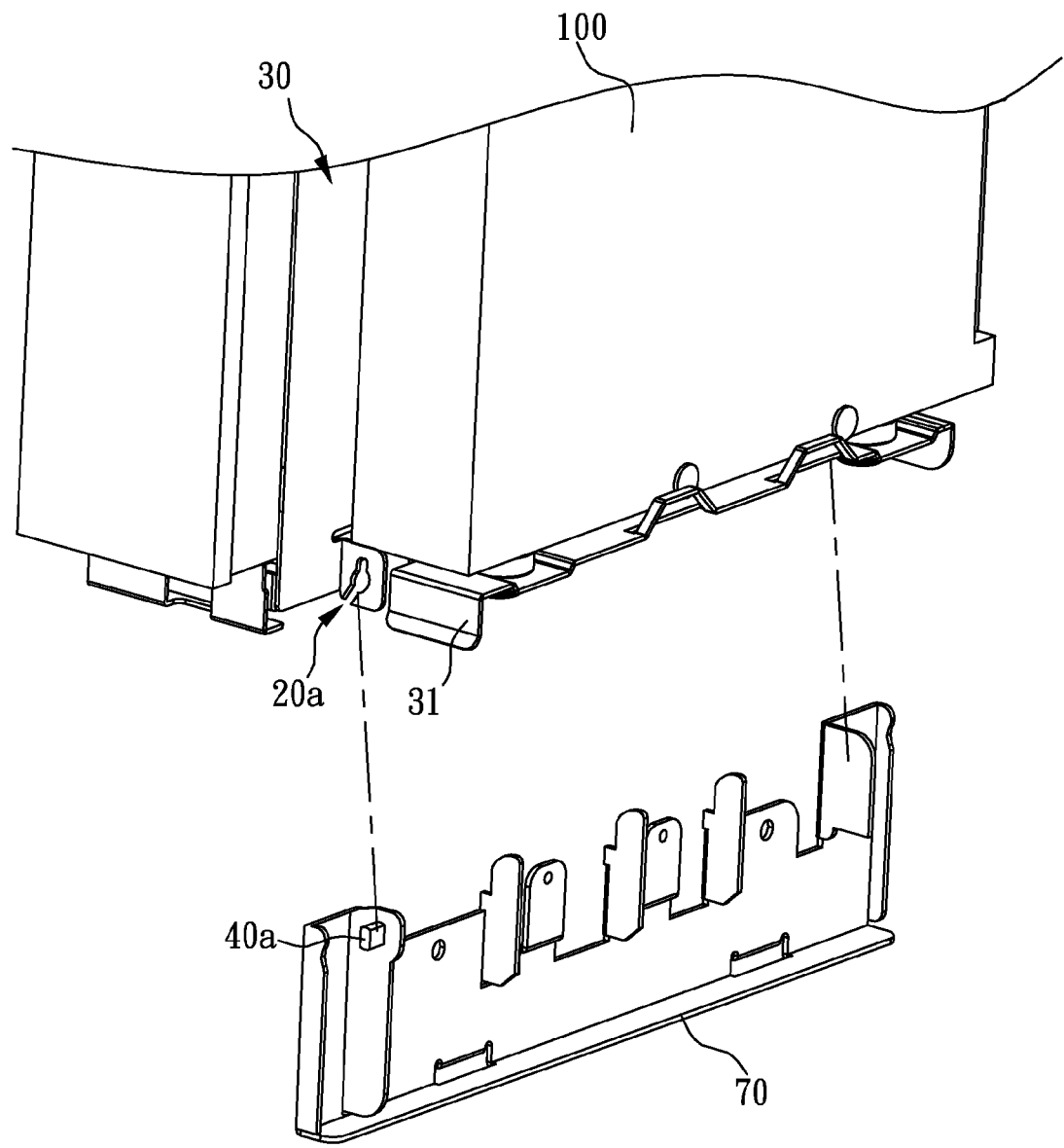
FIG. 13 illustrates a partial schematic drawing of the separated pivot part and the electronic device fastening set of the second embodiment of the present invention.

Please refer to FIG. 13, which illustrates the second embodiment of the present invention. FIG. 13 illustrates a partial schematic drawing of the separated pivot part and the electronic device fastening set of the second embodiment of the present invention.

As shown in FIG. 13, the second embodiment differs from the first embodiment of the present invention in that, in the second embodiment, the pivot structure 20*a* is located on the electronic device fastening set 30, and the pivot axis 40*a* is located on the pivot part 70; the electronic device fastening set 30 can rotate via the pivotal connection between the pivot axis 40*a* and the pivot structure 20*a*.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A computer host case structure, for fastening at least one electronic device, the computer host case structure comprising:
    a main body;
    two pivot structures, respectively comprising a notch;
    two pivot axes, for pivotally connecting to the two pivot structures;
    an electronic device fastening set, for fastening the at least one electronic device, wherein the electronic device fastening set comprises at least one fastening unit, wherein via a pivotal connection between the two pivot axes and the two pivot structures, the electronic device fastening set rotates relative to the main body;
    a pivot part connected to the main body; and
    at least one fastening part located on the pivot part,
    wherein when the electronic device fastening set rotates relative to the main body to a specific angle, the two pivot axes respectively enter the notches of the two pivot structures, and
    wherein when the pivot axis enters the notch, the at least one fastening part is correspondingly fastened to the at least one fastening unit.

2. The computer host case structure as claimed in claim 1, wherein the two pivot structures are located on the pivot part and the two pivot axes are located on the electronic device fastening set.

3. The computer host case structure as claimed in claim 2, further comprising at least one buffer unit, wherein the at least one buffer unit is located on the pivot part; when the electronic device rotates relative to the main body, the buffer unit contacts the electronic device fastening set.

4. The computer host case structure as claimed in claim 3, wherein the buffer unit further comprises an arcuate portion;

when the electronic device rotates relative to the main body, the arcuate portion contacts the electronic device fastening set.

5. The computer host case structure as claimed in claim 4, wherein the buffer unit further comprises a stopper portion; when the pivot axis enters the notch, the movement of the electronic device fastening set is limited by the stopper portion.

6. The computer host case structure as claimed in claim 2, wherein the electronic device fastening set further comprises two fixing parts, and two sides of the at least one electronic device are fastened by the two fixing parts.

7. The computer host case structure as claimed in claim 1, further comprising a pivot part connected to the main body, wherein the two pivot structures are located on the electronic device fastening set and the two pivot axes are located on the pivot part.

8. The computer host case structure as claimed in claim 7, further comprising at least one buffer unit, wherein the at least one buffer unit is located on the pivot part; when the electronic device rotates relative to the main body, the buffer unit contacts the electronic device fastening set.

9. The computer host case structure as claimed in claim 7, wherein the electronic device fastening set further comprises two fixing parts, and two sides of the at least one electronic device are fastened by the two fixing parts.

10. The computer host case structure as claimed in claim 1, wherein the pivot structure further comprises a pivot hole and an opening, and the pivot hole is connected to the notch and the opening.

11. The computer host case structure as claimed in claim 10, wherein the pivot axis comprises two long sides and two arc sides, a distance between the two long sides is corresponded to a size of the notch and the opening, and a distance between the two arc sides is corresponded to a size of the pivot hole.

12. The computer host case structure as claimed in claim 11, wherein when the electronic device fastening set rotates to a specific angle relative to the main body via the pivotal connection between the two pivot axes and the two pivot structures, the two long sides become aligned with the notch, allowing the pivot axis to enter the notch.

13. The computer host case structure as claimed in claim 1, wherein a range of the specific angle is from 70° to 100°.

\* \* \* \* \*